United States Patent
Goyal et al.

(10) Patent No.: US 6,246,762 B1
(45) Date of Patent: *Jun. 12, 2001

(54) SPRING BIASED MICROPHONE SUB-ASSEMBLIES

(75) Inventors: Suresh Goyal, Warren; Pratod V. Kasbekar, Manalapan; Harish S. Mangrulkar, Colonia; Sanjay Upasani, Manalapan, all of NJ (US)

(73) Assignee: Lucent Technologies, Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/075,566

(22) Filed: May 11, 1998

Related U.S. Application Data

(63) Continuation of application No. 08/941,504, filed on Sep. 30, 1997, now abandoned.

(51) Int. Cl.[7] .................................................. H04M 1/00
(52) U.S. Cl. ............................................................ 379/433
(58) Field of Search ................................... 379/433, 428; 381/355, 360, 368

(56) References Cited

U.S. PATENT DOCUMENTS

| 4,443,666 | 4/1984 | Cote | 179/4 |
|---|---|---|---|
| 4,556,264 | 12/1985 | Tanaka | 339/17 LC |
| 4,690,242 | * 9/1987 | Mark | 181/0.5 |
| 4,700,383 | 10/1987 | Takagi et al. | 379/421 |
| 4,773,091 | * 9/1988 | Busche et al. | 379/433 |
| 4,803,724 | 2/1989 | Utoh | 379/433 |
| 5,802,198 | * 9/1998 | Beavers et al. | 381/344 |
| 5,982,882 | * 11/1999 | Kasbekar et al. | 379/433 |

* cited by examiner

*Primary Examiner*—Jack Chiang
(74) *Attorney, Agent, or Firm*—Michael Y. Epstein; Henry I. Schanzer

(57) ABSTRACT

Microphone sub-assemblies for direct mounting on a telephone handset inner substrate comprise a tubular housing containing a microphone having terminal pins electrically connected within the tubular housing to leads extending through the housing tubular wall. The leads provide contact springs for spring biased contact with conductive lands on the substrate. In one embodiment, the contact springs comprise coiled springs and, in another embodiment, the contact springs comprise leaf springs terminating in arcuate cam surfaces.

9 Claims, 5 Drawing Sheets

SPRING BIASED MICROPHONE SUB-ASSEMBLIES

This is a continuation application of Ser. No. 08/941,504, now abandoned, filed Sep. 30, 1997.

BACKGROUND OF THE INVENTION

This invention relates to microphone sub-assemblies for inclusion in telephones and the like, and particularly to microphone sub-assemblies which lend themselves to automated mounting procedures.

As last steps in the manufacture of a telephone handset, a fairly rigid substrate, which may comprise one or more printed circuit boards with various electronic/optical components mounted thereon, is sandwiched between two molded plastic housing halves which are snap-fitted or otherwise fastened together. These last steps are well suited for automated assembly processes using relatively simple robotic (programmed) tools. A complication in the assembly process, however, is the microphone sub-assembly which must also be mounted within the telephone handset.

In one arrangement, the microphone sub-assembly comprises a quite small circular cylinder having end ports for admitting sound to a transducer within the cylinder and a two-part molded plastic container snap-fitted around the microphone cylinder. The plastic container serves a number of roles: it encloses and protects the microphone (as well as providing one or more internal acoustic sound chambers); it provides surfaces for firm mounting of the container within the housing; and it provides a sealed exit port for wires from the microphone to a wire terminating connector which, as part of the assembly process, is snap-fitted within a mating connector on the component containing substrate.

The complication presented by the microphone sub-assembly is that it is quite difficult to assemble the sub-assembly into the handset. Thus, in addition to the steps of picking-up and properly orienting and mounting the sub-assembly, the connector at the end of the microphone wires must be inserted into its mating connector on the substrate and the microphone wires must be properly nested within the housing. If the wires are not properly nested, they can be pinched between the two housing halves when they are snap-fitted together. This, of course, causes numerous problems. Indeed, owing to the difficulty of assembling the microphone sub-assembly into the handset, this assembly is generally done by hand rather than, as preferred, by machine. This problem, among others, is addressed by the invention.

SUMMARY OF THE INVENTION

A one piece tubular housing contains a microphone within a passageway through the housing. The microphone includes terminal pins which are electrically connected within the housing to electrical leads which extend through the wall of the tubular housing into the housing passageway. The housing electrical leads provide means for direct, spring biased electrical contact with conductive lands on the substrate. In one embodiment, the electrical leads are shaped to provide leaf springs directly engaged with the substrate lands. In another embodiment, the electrical leads are electrically connected to coiled springs which are compressively engaged with the substrate lands.

With either embodiment, the microphone tubular housing is forcibly snap or press fitted within a seat on the substrate. The forced mounting of the microphone sub-assembly on the substrate provides positive electrical contacting between the sub-assembly terminals and a mating connector on the substrate. Preferably, the microphone tubular housing is mounted at right angles to the plane of the substrate such that the opposite open ends of the tubular housing face in opposite directions relative to the substrate. The housing open ends are then acoustically sealed by engagement with sound admitting portions of the hand-set housing halves which are snap fitted into place on and around the substrate.

BRIEF DESCRIPTION OF THE DRAWINGS

Some of the drawings are schematic and not to scale.

DESCRIPTION OF PREFERRED EMBODIMENTS

Figure 1:
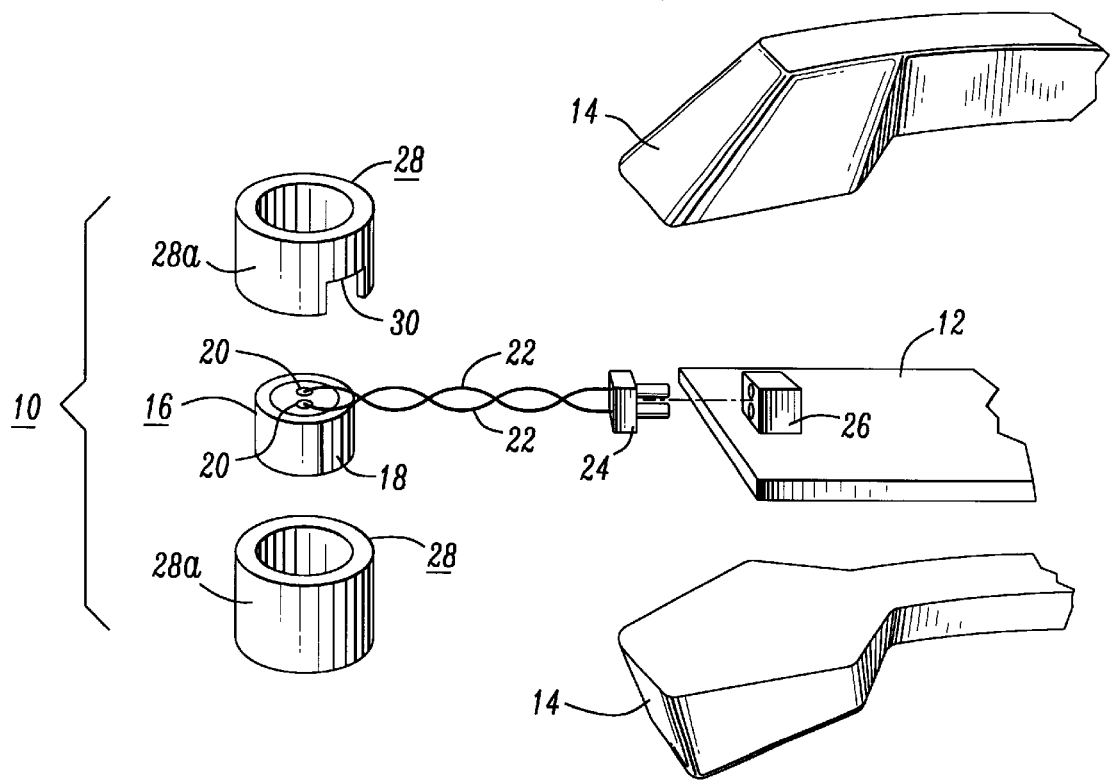
FIG. 1 is a view, in perspective and exploded, of a known microphone sub-assembly for use in a telephone handset.

FIG. 1 shows an example of a prior art microphone sub-assembly 10 and a portion of a substrate 12 to which the sub-assembly 10 is connected. Both the microphone sub-assembly and the substrate are disposed within a telephone handset housing formed by molded plastic housing halves 14 which are snap-fitted together onto and around the substrate in known manner.

The microphone sub-assembly 10 comprises a basic microphone 16 comprising a circular cylindrical can 18 containing an acoustically sensitive diaphragm producing an electrical signal picked-up by two electrodes connected to terminal pins 20 extending a short distance outwardly from the can 18. The two pins are soldered to the ends of wires 22 terminating in a connector 24 for mating with a corresponding connector 26 mounted on the substrate 12. The microphone 16 is disposed within a container 28 shown in FIG. 1 as comprising two halves 28a which are glued together. The container 28, e.g., of rubber, protects the microphone as well as providing one or more acoustic chambers adjoining sound entry ports into the microphone for providing certain processing of the sound reaching the microphone diaphragm. (In microphones having noise-cancelling characteristics, sound ports are provided at opposite ends of the microphone can. In use of the microphone, one end faces directly towards a speaker whose speech enters through the microphone one end along with ambient noise. The ambient noise also enters the other end of the microphone which, because of the position of the microphone other end, receives little of the speech sounds. To some extent, aided by electronics on the substrate, the two identical noise signals entering the microphone from opposite ends tend to cancel one another.)

The container 28 has ports for admitting sounds into the acoustic chambers. Preferably, for good sound quality, the container should completely acoustically seal the microphone except for the intended sound ports. A problem with the two piece container, however, is that, as indicated in FIG. 1, a small slot 30 is provided through the wall of one of the container halves 28a for the exiting of the microphone wires. While the two container halves are sealed together along with a sealant fluid placed in the slot 30 for acoustically sealing it, small leakage paths for sound do occasionally occur which are quite detrimental to sound quality. This is one problem solved according to the present invention.

Although not shown in FIG. 1, as being known, the microphone sub-assembly 10 is mounted within a seat or pocket formed by the housing halves 14, and electrical connections between the microphone and the substrate 12 are by way of the wires 22 and the connectors 24 and 26. A problem created by this arrangement, previously referred to, is that the handset assembly process requires that the microphone connector 24 be first mated with the substrate mounted connector 26, and the microphone container 28 then be seated in one of the housing halves with the microphone wires properly nested within the housing half so as not to be pinched between mating portions of the housing halves. While proper assembly is regularly obtained, the care required to accomplish it generally precludes the use of simple-minded robotic tools. This is another problem solved by this invention.

One embodiment of the invention is shown in FIGS. 2 through 6. Shown in these figures is a microphone sub-assembly 40 comprising a microphone 42 (FIGS. 4–6) contained within a housing 44. The microphone 42 is basically the same as previously used except that the microphone electrical pins 46 (FIGS. 2 and 4) are somewhat larger than as previously used. (In the prior art arrangement shown in FIG. 1, the pins 20 are of a length just sufficient to enable the soldering of the pins to the ends of the wires 22.) Also, while the housing 44 of the inventive sub-assembly is different (as hereinafter described) from the container 28 shown in FIG. 1, acoustic chambers disposed at opposite ends of the housing can be identical in design and function as the acoustic chambers formed by the prior art container 28.

Figure 13:
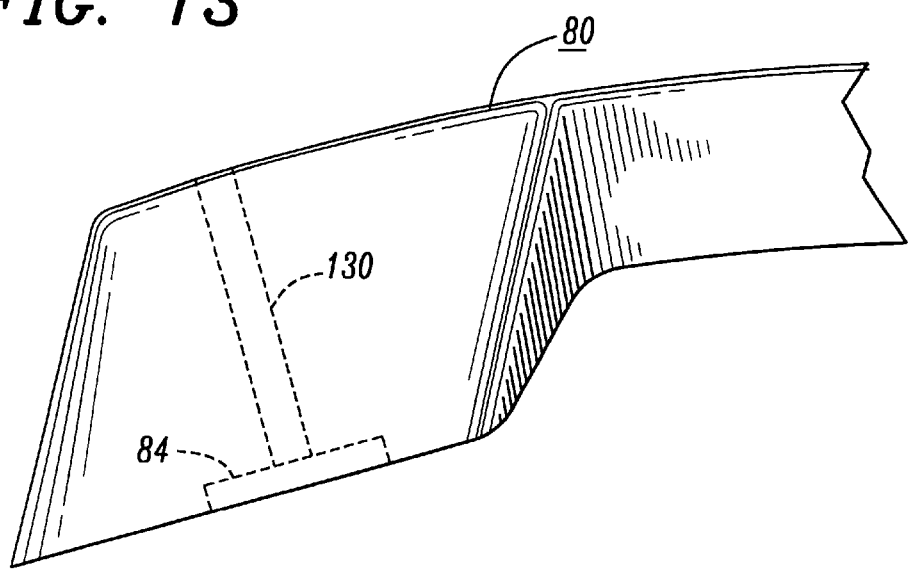
FIG. 13 is a side section, partly exploded, of a portion of a telephone handset showing the orientation of a microphone sub-assembly within the handset.
Figure 13:
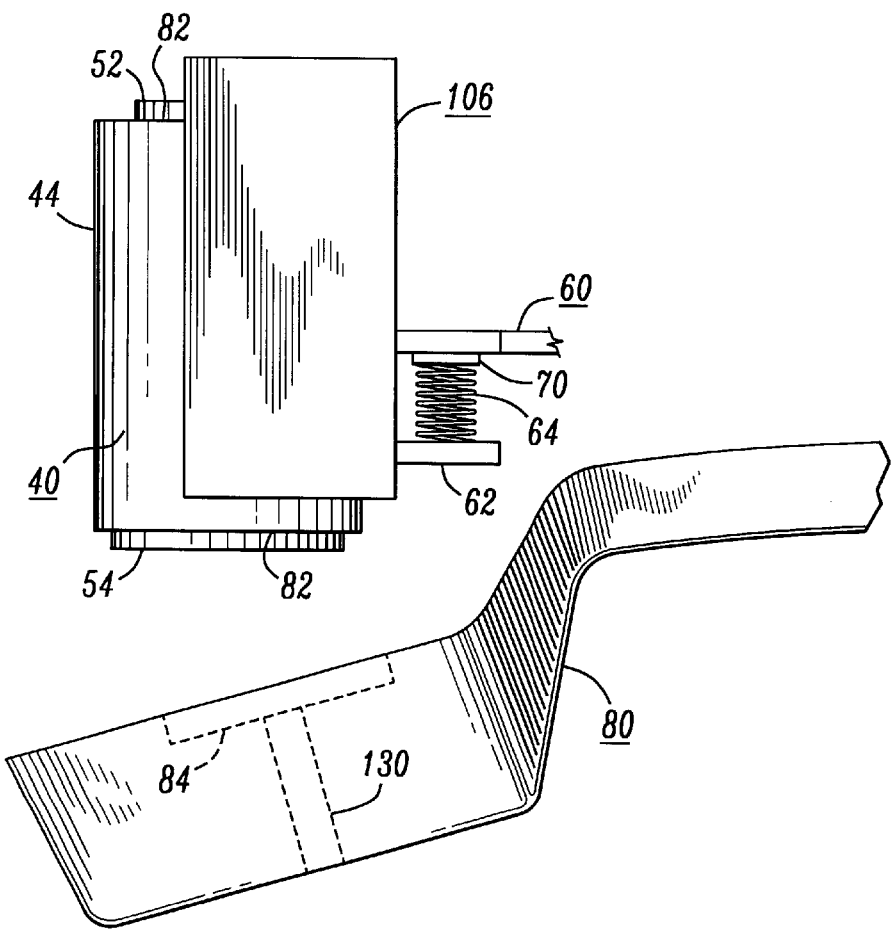

The housing 44 has a circular passageway 50 therethrough having open ends 52 and 54. The wall 56 defining the passageway 50 is solid but includes two electrical leads 58 extending through the wall 56 in hermetically sealed relation therewith. The two leads 58 project into the passageway 50 but do not completely fill or block the passageway. The leads 58 extend exteriorly from the wall and provide means for making direct electrical connections to electrical contacts on a substrate 60 (FIG. 13). The electrical contacting is described hereinafter. The housing can be of molded plastic, for example, of ABS or polycarbonate material made in accordance with known molding techniques.

Two contacting arrangements are used.

Figure 2:
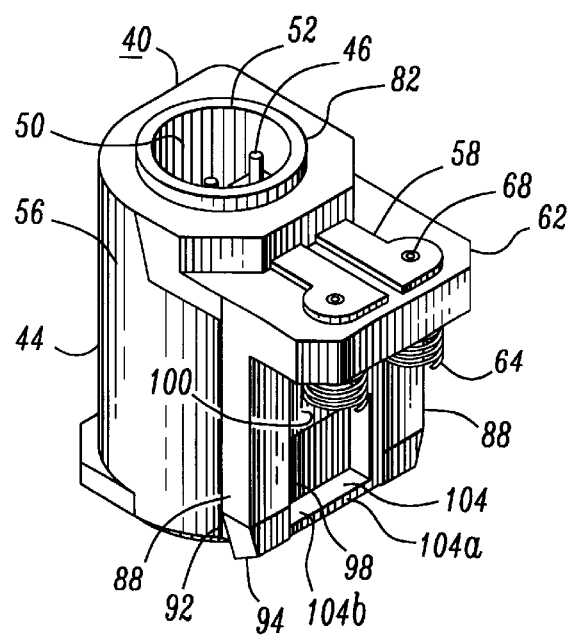
FIG. 2 is a view, in perspective, of an embodiment of a microphone sub-assembly including coiled spring contacts in accordance with this invention.

In one arrangement, as shown in FIG. 2, external portions of the leads 58 rest on a platform 62 integrally extending from the wall 56. Two metal coiled springs 64 terminate in straight length portions 68 (FIGS. 3 and 4) which extend through the platform 62 and into contact with respective leads 58 on the platform. The spring straight portions 68 extend through holes through the leads 58 and are soldered thereto. When the microphone sub-assembly 40 is mounted directly on the substrate 60 (as shown in FIG. 13 and described hereinafter), the coiled springs 64 are slightly compressed and provide spring biased electrical contacts with conductive lands 70 on the substrate 60.

Figure 7:
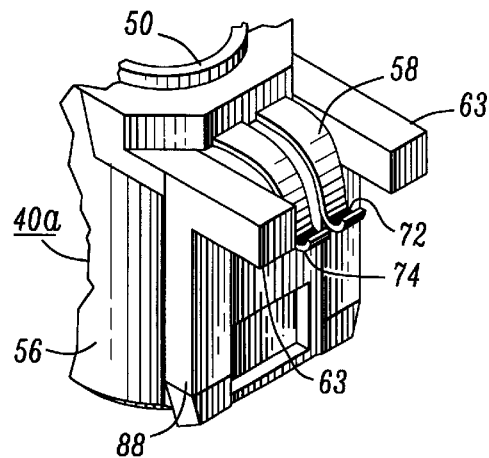
FIG. 7 is similar to FIG. 2 but showing a second embodiment of an inventive microphone sub-assembly.

In another arrangement, as shown in FIG. 7 (showing a microphone sub-assembly 40a), external portions of the leads 58 are shaped to provide curved leaf springs 72 terminating in curved cam-like contact surfaces 74. As with the coiled springs 64 shown in FIG. 2, when the sub-assembly 40a is mounted on a substrate 60 (FIG. 11), the contact surfaces 74 are in spring biased contact with substrate conductive lands 70.

The two spring biased contacting arrangements shown in FIGS. 2 and 7 provide positive electrical contacting without the need for soldering or the like.

Figure 4:
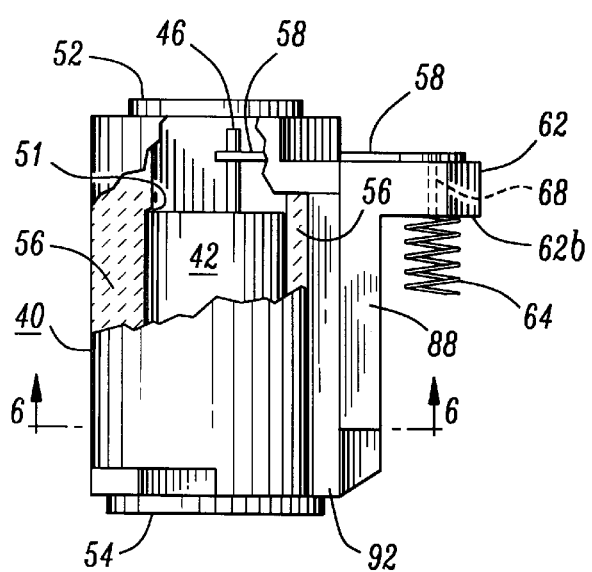
Figure 5:
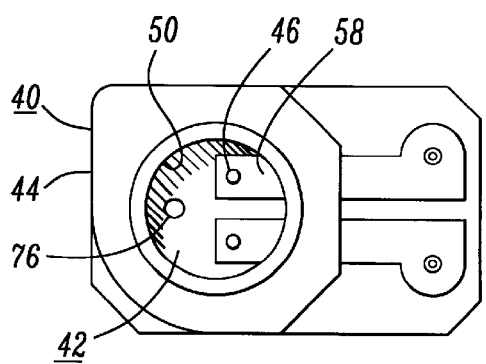
Figure 6:
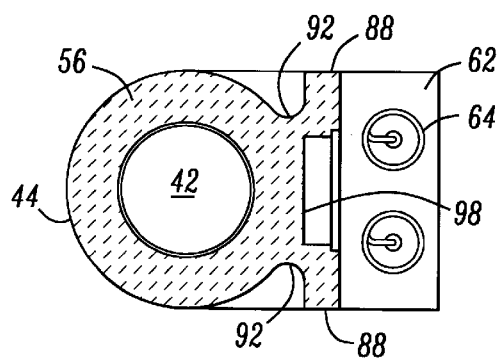
FIG. 6 is a cross-section taken along line 6—6 of FIG. 5.

Returning to consideration of FIGS. 4 and 5, the microphone 42 is disposed within the passageway 50 in a snug fit therewith to provide firm support for the microphone as well as to acoustically seal the opposite ends of the microphone from each other. Also, the microphone can be glued in place and gaskets provided on the microphone ends for firmer contacting and sound proofing.

As shown in FIGS. 4 and 5, the leads 58 extending into the housing passageway 50 have holes therethrough, and in the process of inserting the microphone 42 into the housing 44, the microphone pins 46 are threaded through the lead holes. Thereafter, the pins 46 are soldered to the leads 58.

As shown in FIG. 4, the top end of the microphone can 18 is spaced below the housing leads 58, e.g., by contact with a shoulder 51 within the passageway 50. The distance spanned by the microphone pins 46 and the leads 58 is the reason that the microphone pins 46 are longer than the pins 20 used in the prior art sub-assembly shown in FIG. 1.

In all the embodiments illustrated herein, the microphone 42 is of the noise-cancelling type and includes sound admitting ports at both ends of the microphone. One such port 76 is shown in FIG. 5. Similarly, as with the prior art sub-assembly 10 shown in FIG. 1, open space is provided between the ends of the microphone and the open ends 52 and 54 of the housing 44. These spaces provide, when the sub-assembly is enclosed within the telephone housing, acoustic chambers for improved sound quality. Acoustic chambers are known, as previously noted, and except as may be required owing to any changes in materials and dimensions from those used in the known sub-assemblies, the acoustic chambers in the inventive sub-assemblies can be identical to prior used acoustic chambers.

As previously indicated, and described further hereinafter, the avoidance of leakage sound paths into the housing 44 is extremely important for sound quality. One problem discussed in connection with the known sub-assembly shown in FIG. 1 is the occasional poor sealing of the exit port 30 through the container 28 for the wires 22. In the inventive sub-assemblies, this problem is substantially completely eliminated. Herein, the housing leads 58 are integrally molded within the housing material. Using known molding techniques, the leads 58 are quite reliably hermetically sealed to the housing wall 56 and the incidence of sound leakage paths through the lead-to-wall joints is effectively zero.

Sounds are introduced into the housing 44 through the open ends 52 and 54 thereof via ports in the telephone outer housing 80 (FIG. 13). To insure that sounds arrive only through the proper ports and not along leakage paths, the open ends 52 and 54 of the housing terminate in integrally formed O-rings 82 (shown most clearly in FIG. 2). As described hereinafter, the O-rings 82 mate with sealing rings 84 (FIG. 13) surrounding the sound ports through the telephone outer housing for sealing the housing open ends 52 and 54 against sounds arriving from paths other than through the desired handset sound ports.

The microphone sub-assemblies 40 and 40a are to be firmly mounted on the substrate 60. The snap-fitting together of parts is known and various arrangements can be used. The arrangement now to be described provides a quite positive locking of the sub-assemblies to the substrate while allowing easy removal of the sub-assemblies without breakage of the joint forming members.

Disposed on the sub-assembly housing 44 are two parallel rails 88 (FIG. 2) extending downwardly from the bottom of the platform 62. The rails 88 are to slide within spaced apart channels 90 (FIG. 8) on the substrate 60 with each of the two rails being received within a respective channel 90. To this end, access to each rail is provided by means of vertical indentations 92 in the housing walls 56 behind the rails and extending parallel to the rails and between the rails. The vertical indentations 92 are clearly visible in FIGS. 4 and 6 and just barely visible in FIGS. 2 and 3.

The rails 88 are inserted bottom end 94 (FIG. 2) first into the substrate channels 90 and, to this end, the sides of the rails are inwardly tapered at the rail bottom ends 94 to facilitate such insertion.

In the sub-assembly 44a shown in FIG. 7 containing the leaf springs 72, a platform comparable to the platform 62 shown in FIG. 2 is not required to support the leaf springs. However, two spaced-apart arms 63 are provided from which the rails 88 downwardly extend. The two arms 63, as well as the bottom surfaces 62b of the platform 62 shown in FIGS. 3 and 4, serve as motion limiting steps. This is described hereinafter.

Figure 3:
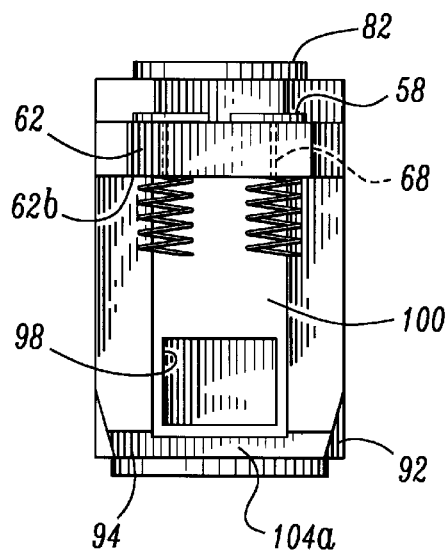
FIGS. 3, 4, and 5 are front, side and top views, respectively, of the sub-assembly shown in FIG. 2.

The two rails 88 are spaced apart and, as shown in FIGS. 2 and 3, a square indentation 98 is provided in the wall 100 between the rails 88. The indentation 98 is to cooperate with a leaf spring 102 (FIG. 8) mounted on the substrate 60 between the two channels 90 for releasably locking the microphone sub-assembly in place on the substrate 60. As shown most clearly in FIG. 2, the lower end of the indentation 98 is framed by a horizontally extending wall 104. The outwardly facing surface 104a of the wall is recessed slightly inwardly of the outwardly facing surfaces of the rails 88. An inner surface 104b of the wall 104 is perpendicular to the axes of elongation of the two rails 88.

Figure 8:
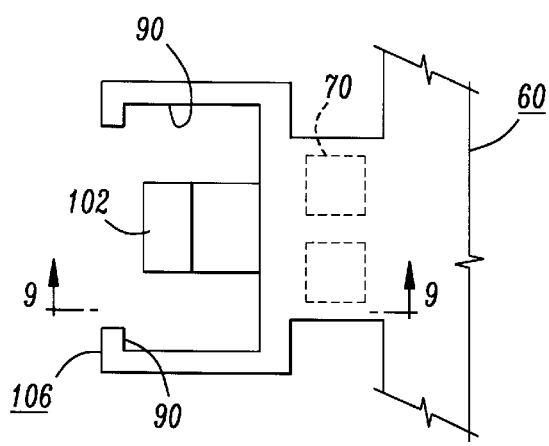
FIG. 8 is a plan view of a portion of a substrate for mounting either of the sub-assemblies shown in FIGS. 2 and 7.

Additional detail is now provided concerning the seat on the substrate 60 within which the microphone sub-assemblies 40 or 40a are to be releasably mounted. As shown in FIG. 8, the seat 106 (comprising the aforementioned pair of spaced apart channels 90 and the leaf spring 102) is disposed at an end of the handset inner substrate 60. The substrate 60 can be of known design except for, in accordance with the present invention, the extending seat 60 and the use of conductive land areas 70 (FIG. 13) on the substrate 60 for making electrical connections to the microphone terminals. (In the known arrangement shown in FIG. 1, the microphone sub-assembly 10 is not mounted directly on the substrate, and the connector 24 at the end of the microphone wires 22 is inserted within a connector 26 mounted on the substrate 12.)

Figure 9:
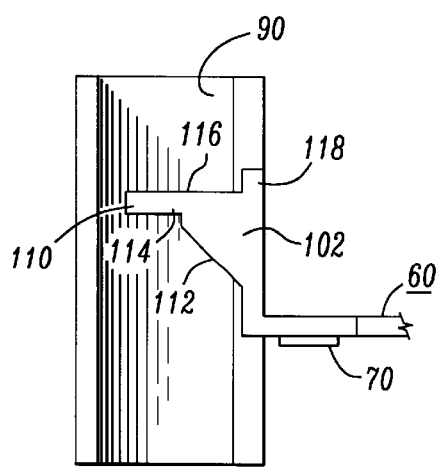
FIG. 9 is a cross-section taken along line 9—9 of FIG. 8.
Figure 10:
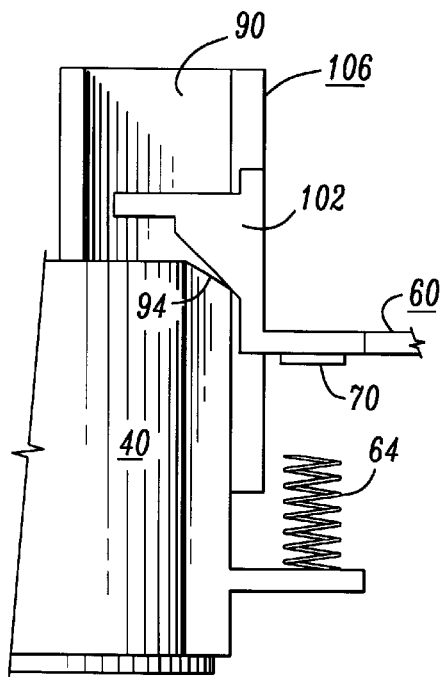
FIG. 10 is a view similar to FIG. 9 but showing the sub-assembly shown in FIG. 2 in the process of being mounted on the substrate portion.

Of significance, the two seat channels 90 extend perpendicularly to the plane of the substrate 60. This results in the microphone housing 44 being likewise oriented (FIG. 13) perpendicular to the substrate. The seat leaf spring 102 (a cantilevered vertically extending strip of plastic material integral with a plastic molded layer forming part of the laminated substrate) terminates in a latch member 110 (FIG. 9) comprising a tapered side surface 112 leading to an extending lip 114 at the end of a flat surface 116 terminating at a vertical wall 118.

The mounting of a sub-assembly 40 within the substrate seat 106 is now described in connection with FIGS. 8–13. The rails 88 of a sub-assembly (the sub-assembly 40 being shown) are first aligned (FIG. 10) with the two channels 90 of the seat 106 and inserted into the channels with the tapered rail ends 94 leading. The dimensions of the various parts are such that as the rails 88 enter the channels 90 little resistance is initially encountered. (The terms "rails" and "channels" are used in accordance with the appearance of the various members. Strictly speaking, during the insertion process, the channel outer walls 90a function as rails sliding within channels formed by the indentations 92 (FIG. 12) behind the rails 88.

Then, as the horizontal end wall 104 at the leading end 94 of the rails 88 reaches (FIG. 10) the tapered side surface 112 of the seat leaf spring 102, the leaf spring 102 is forced backwardly relative to the sub-assembly 40. With continued movement of the sub-assembly inwardly of the seat 106, contact is made between the electrical terminals (e.g., the coiled springs 64) of the sub-assembly 40 and the conductive lands 70 on the substrate 60. With still further inward movement of the sub-assembly 40, the springs 64 become compressed against the lands 70.

Figure 11:
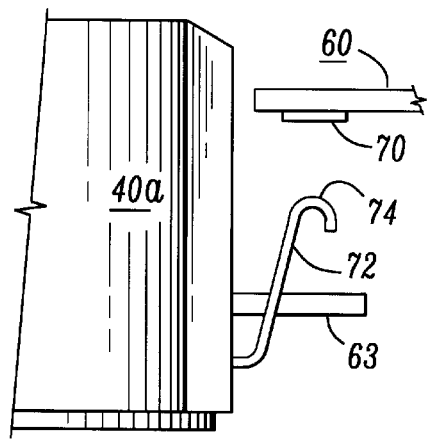
FIG. 11 is a view similar to FIG. 10 but showing the mounting of the sub-assembly shown in FIG. 7.
Figure 12:
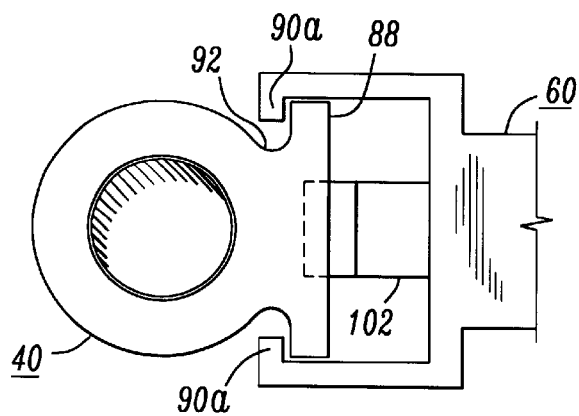
FIG. 12 is a view similar to FIG. 8 but showing a plan view of the structure illustrated in FIG. 10.

FIG. 11 shows the mating relation of a leaf spring 72 of the sub-assembly 40a (FIG. 7) with a contact 70 on a substrate 60. During insertion of the sub-assembly 40a into the substrate 60, contact of the curved bottom surfaces 74 of the leaf springs 72 causes increasing flexure of the springs 72 as the sub-assembly 40a moves further inwardly of the seat 106. The curved surfaces 74 of the springs 72 allow sliding movement of the surfaces 74 relative to the substrate conductive land surfaces 70 in response to such increasing spring flexure without gouging of the conductive surfaces 70.

Eventually, and with increasing pressure required for increasingly straining the spring contacts 64 or 72, as well as for continued flexure of the seat leaf spring 102, the horizontal wall 104 of the sub-assembly indentation 98 clears the flat end surface 116 of the leaf spring 102 allowing the spring 102 to spring into the indentation 98. Contact of the flat surface 116 of the spring 102 against the inner surface 104b of the indentation wall 104 serves to prevent retraction of the sub-assembly from within the substrate seat 60.

Still further insertion of the sub-assembly inwardly of the seat terminates when the forces provided by the stressed springs 64 or 72 reach a preselected level detectable by the inserting mechanism.

The sub-assembly 40 or 40a is now firmly locked within the substrate seat 60 with the seat leaf spring 102 pressing the sub-assembly rails 88 laterally outwardly against the seat outer channel walls 90a. Also, contact of the leaf spring flat end surface 116 against the inside surface 104b of the indentation end wall 104 prevents vertical movement of the sub-assembly in response to the force applied by the strained spring contacts (the coils 64 or the leaf springs 72). The force exerted by these strained springs maintains the spring contacts firmly contacted with the substrate conductive lands 108.

The mounted sub-assembly 40 or 40*a* is readily removed from within the seat 106 by means of a small pointed tool (not illustrated) for pressing against the vertical wall 118 of the seat leaf spring 102 for pivoting the spring out of the sub-assembly indentation 98. The sub-assembly is then readily slid out of the seat 106.

With the microphone sub-assembly firmly mounted on the substrate 60, the telephone can be completed in usual fashion by snap fitting the telephone housing halves onto and around the substrate.

In known manner, the telephone outer housing 80 (FIG. 13) is fitted with one or more sound ports 130 for admitting sound into the microphone. Two sound admitting ports 130 (for a noise-cancelling telephone) are aligned with the opposite open ends 52 and 54 of the microphone housing 44, and the various parts are so dimensioned that, when properly fitted together, rubber O-rings 84 on the inside surfaces of the outer housing halves in surrounding relation with the sound ports 130 are press fitted against the O-rings 82 at the ends of the sub-assembly housing. The rubber O-rings 132 substantially completely seal the ends 52 and 54 of the microphone housing against any sounds arriving other than through the handset sound ports.

In the case of telephones not including the noise cancelling feature, no changes are required other than that sound is introduced into only one open end of the sub-assembly housing sealed against but one telephone sound port.

As mentioned, the strained spring contacts 64 (FIG. 10) or 74 (FIG. 11) maintain the contacts firmly against the substrate contact lands. Thus, good electrical contacting is obtained without the need for soldering or other bonding processes. Additionally, the biased spring contacts provide protection against breaking of electrical contacts owing to impact forces against the telephone handset, particularly from accidental droppings of the handset.

What is claimed is:

1. A sub-assembly in combination with a substrate containing conductive lands on a surface of the substrate, said sub-assembly comprising a housing including a tubular wall defining a space within the housing, a microphone having terminal pins within said space, and leads hermetically sealed through said wall in electrical contact with said terminal pins, portions of said leads external to said wall comprising strainable springs, said sub-assembly being mounted on said substrate with said sub-assembly springs directly contacting said substrate lands, and said strainable springs comprising coiled springs for being compressively strained by contact with said substrate conductive lands.

2. A sub-assembly in combination with a substrate containing conductive lands on a planar surface of the substrate, said sub-assembly comprising a housing including a tubular wall defining a space within the housing, a microphone having terminal pins within said space, and leads hermetically sealed through said wall in electrical contact with said terminal pins, portions of said leads external to said wall comprising strainable springs, said sub-assembly being mounted on said substrate with said sub-assembly springs directly contacting said substrate lands, said tubular wall being elongated along an axis passing through an open end of said wall, said microphone having a sound admitting port facing towards said open end, and said tubular wall including an integral mounting bracket for mounting said sub-assembly with said tubular wall axis being disposed transversely of said substrate surface.

3. A sub-assembly according to claim 2 wherein said strainable springs comprise coiled springs elongated along axes parallel to said first axis for being compressively strained by contact with said substrate conductive lands.

4. A combination according to claim 2 wherein said strainable springs comprise leaf springs elongated along axes parallel to said first axis for being pivotally strained by contact with said substrate conductive lands, said leaf springs being integral extensions of said leads.

5. A combination according to claim 4 wherein said leaf springs terminate in curved contact areas extending generally transversely of said tubular wall axis for facilitating sliding contact between said curved contact areas and said conductive lands.

6. A combination according to claim 2 wherein said mounting bracket comprises a pair of spaced apart and parallel rails elongated along axes parallel to said tubular wall axis, and said substrate includes a seat for snug receipt of said rails.

7. A combination according to claim 6 wherein said seat comprises a pair of spaced apart and parallel channels disposed perpendicular to said substrate surface for receipt, respectively, of each of said rails.

8. A combination according to claim 7 wherein said tubular wall includes an indentation disposed between said rails mounted on said tubular wall, and said seat includes an elastic latching member disposed between said channels for entry into said indentation for latching said sub-assembly in place within said substrate seat.

9. A combination according to claim 3 including a rigid platform mounted on said tubular wall and extending laterally outwardly from said wall perpendicular to the tubular wall axis, said leads extending along a first surface of said platform, and said coiled springs being dependent from said platform by means of extensions of said springs extending entirely through said platform and being electrically connected to respective leads on said platform.

* * * * *